(12) United States Patent
Wu et al.

(10) Patent No.: US 7,160,800 B2
(45) Date of Patent: Jan. 9, 2007

(54) DECREASING METAL-SILICIDE OXIDATION DURING WAFER QUEUE TIME

(75) Inventors: Zhen-Cheng Wu, Hsinchu (TW); Cheng-Hung Chang, Hsinchu (TW); Yu-Lien Huang, Jhubei (TW); Shwang-Ming Cheng, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 121 days.

(21) Appl. No.: 10/905,517

(22) Filed: Jan. 7, 2005

(65) Prior Publication Data

US 2006/0154481 A1  Jul. 13, 2006

(51) Int. Cl.
*H01L 21/4763* (2006.01)
*H01L 23/48* (2006.01)

(52) U.S. Cl. .................. 438/642; 438/649; 438/682; 257/754; 257/757

(58) Field of Classification Search ............... 438/642, 438/643, 648–653, 655, 682, 683, 685; 257/382, 257/384, 388, 413, 754, 755, 757
See application file for complete search history.

(56) References Cited

U.S. PATENT DOCUMENTS

| 6,287,966 | B1 | 9/2001 | Lui et al. |
| 6,586,331 | B1 | 7/2003 | Lui et al. |
| 6,916,699 | B1 * | 7/2005 | Agarwal ................ 438/238 |

* cited by examiner

*Primary Examiner*—Kevin M. Picardat
(74) *Attorney, Agent, or Firm*—Baker & McKenzie LLP

(57) ABSTRACT

Disclosed herein are various embodiments of semiconductor devices and related methods of manufacturing a semiconductor device. In one embodiment, a method includes providing a semiconductor substrate and forming a metal silicide on the semiconductor substrate. In addition, the method includes treating an exposed surface of the metal silicide with a hydrogen/nitrogen-containing compound to form a treated layer on the exposed surface, where the composition of the treated layer hinders oxidation of the exposed surface. The method may then further include depositing a dielectric layer over the treated layer and the exposed surface of the metal silicide.

20 Claims, 10 Drawing Sheets

DECREASING METAL-SILICIDE OXIDATION DURING WAFER QUEUE TIME

TECHNICAL FIELD

Disclosed embodiments herein relate generally to the manufacture of semiconductor devices, and more particularly to semiconductor devices and related methods of manufacturing have decreased oxidation on metal silicide components while the semiconductor wafer is in queue awaiting the next processing step.

BACKGROUND

As technology in products and equipment continue to become more complex, the use of integrated circuit (IC) devices in these products and equipment is basically essential. In addition, consumers and manufacturers alike have continued to desire smaller product size, which requires a continued decrease in overall IC chip size. As a result, the large-scale integration of circuit components, such as transistors and capacitors, has become a necessity for decreased overall size, but increased device performance. Thus, semiconductor device improvements have been largely accomplished by reducing device feature size to the point where currently micron and sub-micron device features are being used, and predictions for future device sizes do not foresee an end to the trend of ever smaller and denser devices.

Along with desired reductions in device size, and thus increased chip densities, comes a required reduction in device power consumption that imposes the use of decreased device feature lengths. This is because, as a general rule, device speed varies inversely with device feature length, while power consumption increases approximately with the square of the device feature length. Thus, feature sizes currently being employed are in the micron and sub-micron or 0.5 um range where it is not considered impossible that the feature size of 0.2 um will become a reality in the near future.

Field Effect Transistors (FETs) are at this time used extensively in Ultra Large-Scale Integration (ULSI) applications. FETs are formed using gate electrodes, usually made of polysilicon, over a gate oxide, and adjacent source/drain regions surrounding the gate oxide to define the channel of the device. In the face of reduced device sizes, contact pads are typically employed in the source/drain regions, and over the gate electrode, to improve the electrical connection between the parts of the transistor and metal interconnects dispersed throughout the IC chip to connect circuit components. These contact pads are typically comprised of a metal silicide formed by reacting a deposited metal with the polysilicon it is deposited over. However, reduced device size effectively translates into reduced contact pad size, and it therefore becomes more critical that the electrical connection between the metal interconnects and the silicide pads be strong since the contact area between the two is reduced as well.

Metal silicide has been employed to provide the electrical contact between parts of the semiconductor devices and these metal interconnects primarily because of the reduced contact resistance and sheet resistance provided by metal silicide. However, one of the most significant factors that can impact the strength of the electrical connection between the silicide pads and the metal interconnects (e.g., increased contact and sheet resistance) is oxidation of the metal silicide before the metal interconnect contacting the silicide is formed. This is due to the oxidation of metals when they are exposed to an oxygen-containing environment, and typically the longer the exposure, the more oxide that is formed. Since semiconductor wafers are typically mass-produced, delays in the manufacturing process often leave wafers "in queue," awaiting the next step of the manufacturing process, and queue times of several days are not uncommon.

Thus, if metal silicide pads have been formed but that wafer is put in queue while the metal silicide portions are exposed, those exposed portions begin to oxidize. Of course, the longer the wafer(s) stays in queue awaiting the next step in the manufacturing process, the more oxidation of the silicide takes place. Then, when the awaiting wafer finally reaches the point in the process where the metal interconnects (i.e., metal "plugs") are formed in contact with silicide pads, the oxidized surfaces of the silicide pads detrimentally affect this electrical connection. Specifically, both the contact resistance and sheet resistance of the metal silicide pads are impacted, which results in reduced stability in the electrical connections, and thus a reduction in device performance. Accordingly, what is needed is a technique for reducing or eliminating the oxidation of exposed metal silicide in semiconductor wafers when those wafers are held in queue during the manufacturing process.

BRIEF SUMMARY

Disclosed herein are various embodiments of semiconductor devices and related methods of manufacturing a semiconductor device. In one embodiment, a method includes providing a semiconductor substrate and forming a metal silicide on the semiconductor substrate. In addition, the method includes treating an exposed surface of the metal silicide with a hydrogen/nitrogen-containing compound to form a treated layer on the exposed surface, where the composition of the treated layer hinders oxidation of the exposed surface. The method may then further include depositing a dielectric layer over the treated layer and the exposed surface of the metal silicide.

In another aspect, one embodiment of a semiconductor device includes a semiconductor substrate and a metal silicide formed on the semiconductor substrate. In addition, the semiconductor device in this embodiment includes a treated layer formed from an exposed surface of the metal silicide by treating the exposed surface with a hydrogen/nitrogen-containing compound, where the composition of the treated layer hinders oxidation of the exposed surface. In some embodiments, the semiconductor device further includes a dielectric layer deposited over the treated layer and the exposed surface of the metal silicide.

BRIEF DESCRIPTION OF THE DRAWINGS

For a more complete understanding of the principles disclosed herein, and the advantages thereof, embodiments are illustrated by way of example in the following figures in which like reference numbers indicate similar parts, and in which.

DETAILED DESCRIPTION OF PREFERRED EMBODIMENTS

Figure 1:
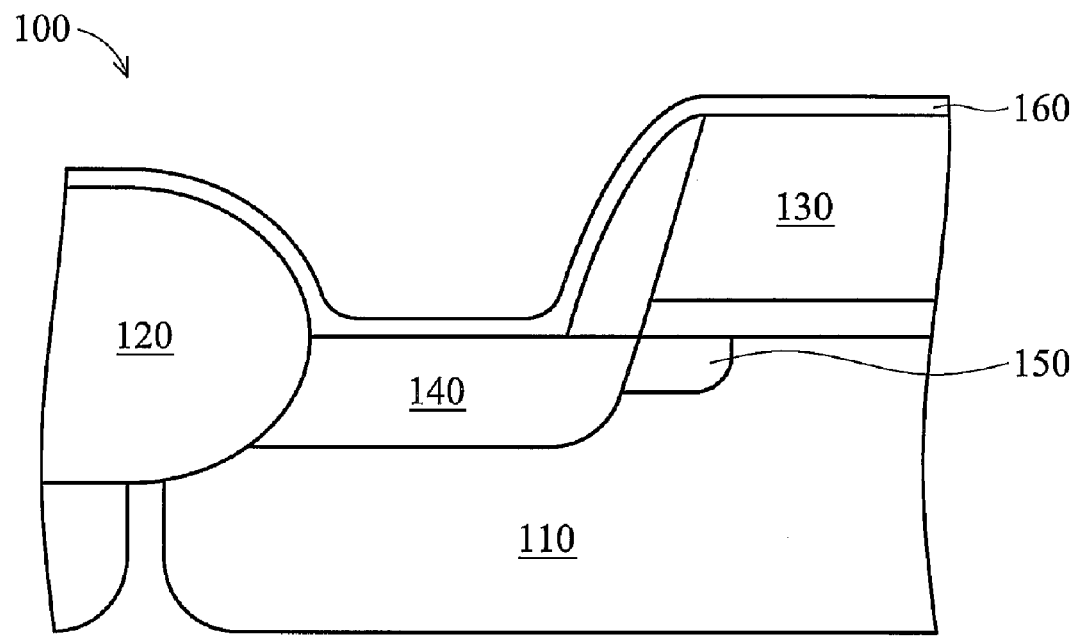
FIG. 1 illustrates one embodiment of a semiconductor device constructed according to the principles disclosed herein.

Referring initially to FIG. 1, illustrated is one embodiment of a semiconductor device 100 constructed according to the principles disclosed herein. The semiconductor device 100 is formed on a semiconductor substrate 110, which may be constructed from bulk silicon, silicon germanium, or may be a silicon-on-insulator (SOI) substrate. Separating active regions on the substrate 110 are field oxides 120 (only one is illustrated), which may be formed using conventional techniques.

In the illustrated embodiment of FIG. 1, the semiconductor device 100 is a metal-oxide-semiconductor (MOS) transistor device 100, which includes a gate electrode 130 formed on the substrate 110. The gate electrode 130 may be formed using polysilicon as in conventional techniques, however, other materials may also be employed. Also constructed as part of the MOS transistor device 100 are a source/drain region 140 and a lightly-doped drain (LDD) region 150. Both of these components of the device 100 may also be formed using conventional doping techniques. Illustrated as formed or deposited over the semiconductor device 100 is a metal layer 160.

Figure 2:
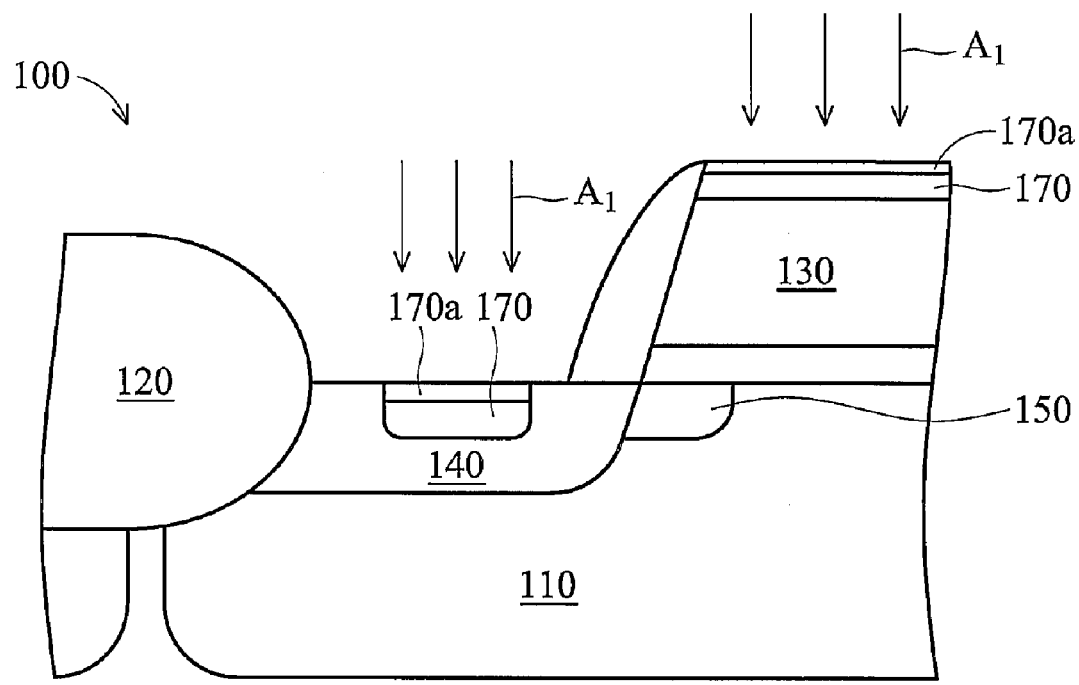
FIG. 2 illustrates the semiconductor device of FIG. 1 further along in the manufacturing process.

Turning now to FIG. 2, illustrated is the semiconductor device 100 of FIG. 1, but further along in the manufacturing process. Specifically, the metal layer 160 deposited over the semiconductor device 100 was selected as a metal that may react with the composition of certain portions of the device 100. For example, the metal layer 160 may be nickel, tantalum, titanium, tungsten, or cobalt, where the metal is selected so as to react with the polysilicon (typically used to form the source/drain regions 140 of the transistor device 100) to form a metal silicide 170 in or on the source/drain region 140. Moreover, in embodiments where the gate electrode 130 of the transistor device 100 is formed from polysilicon, the metal layer 160 may also react with this polysilicon to form a metal silicide 170 over the gate electrode 130. In preferred embodiments of the device 100 constructed according to the disclosed principles, the metal silicide 170 that is formed may be nickel silicide, cobalt silicide, titanium silicide, tantalum silicide, or tungsten silicide. Of course, other types of metal silicide 170 may also be created, and no limitation to any particular silicide composition is intended or should be implied or inferred.

In one embodiment, the next step in the manufacturing process of the semiconductor device 100 is to treat the metal silicide 170 in accordance with the disclosed principles. More specifically, when the metal silicide 170 is formed, a surface of the metal silicide 170 remains exposed. Before any further processing on the metal silicide 170 is done, the exposed surface of the metal silicide 170 is treated with a compound containing hydrogen and nitrogen, as indicated by arrows $A_1$. The treating of the metal silicide 170 with the hydrogen/nitrogen-containing compound results in a portion of the exposed surface reacting with the hydrogen/nitrogen-containing compound to create a thin treated layer 170a of nitrided metal silicide along the exposed surface, which hinders oxidation of the metal silicide 170 when exposed. More specifically, once the hydrogen component of the compound (e.g., plasma) removes the metal oxide formed, the nitrogen component of the compound reacts with the remaining non-oxidized metal silicide to form a thin nitride ('treated') layer over the metal silicide. For example, if nickel silicide is used as the metal silicide, and $NH_3$ is the hydrogen/nitrogen-containing compound, the treatment process (e.g., plasma enhanced chemical vapor deposition (PECVD)) creates a thin treated layer 170a of Ni—Si—N on the exposed surface of the nickel silicide, and this nitrogen-containing treated layer 170a reduces the chance the exposed surface will oxidize while the wafers are in queue time. Moreover, the metal silicide 170 treated is not limited to structures formed in the source/drain regions 140, but may also include metal silicide 170 formed on the gate electrode 130 of a MOS transistor device, as illustrated.

As discussed above, at various stages of the manufacturing process of a semiconductor wafer, portions of semiconductor devices including a metal silicide may be left exposed to the processing or other environment. As the length of exposure of such a metal silicide 170 increases, so does the oxidation on exposed surfaces of the metal silicide 170. Since metal silicide is formed in specific places to aid in electrical contact with metal vias or plugs, oxidation on the metal silicide, which can detrimentally affect such electrical contacts, should be avoided during the manufacturing process. By reducing or altogether preventing oxidation of the metal silicide 170 when it is exposed, even during long queue times, the strength of the electrical contacts between metal silicide contacts and interconnecting vias or plugs formed throughout the integrated circuit are improved. As discussed in further detail with reference to FIGS. 5–8, such improved electrical contact, through oxidation reduction, improves contact resistance ($R_C$) and sheet resistance ($R_S$) of these electrical contacts, thus improving overall IC device performance.

In addition, treating exposed areas of metal silicide 170 as described herein also reduces damage to the silicide caused by contact etching processes. Specifically, the thin treated layer 170a formed on the exposed surface of the silicide 170 by the disclosed treatment process helps protect against contact etching damage, depending on the materials and treatment compounds employed. In an advantageous embodiment, the metal silicide 170 is nickel silicide (NiSi) and the treatment process is performed with $NH_3$ (ammonia) plasma. In this embodiment, the thin treated layer 170a formed on the exposed surface of the NiSi is Ni—Si—N, which provides some protection against typical contact etching techniques. Moreover, virtually no extra tools or costs are associated with incorporating the disclosed treatment process prior to deposition of the etch stop layer 180 since that deposition process and the disclosed treatment process can both employ conventional CVD equipment or PECVD equipment if an $NH_3$ plasma is employed.

In one embodiment, the hydrogen/nitrogen-containing compound is a hydrogen/nitrogen-containing thermal ambient created in the ambient surrounding the semiconductor wafer during manufacturing. In another embodiment, the hydrogen/nitrogen-containing compound is a hydrogen/nitrogen-containing plasma generated at the appropriate time during the manufacturing process to treat exposed metal silicide. In more specific embodiments, the hydrogen/nitrogen-containing plasma may be $NH_3$, $H_2+N_2$, or $NH_3+N_2$. Of course, however, any type of hydrogen/nitrogen-containing compound capable of removing metal oxides that are present and then hindering oxidation of the exposed surface of the metal silicide 170 may be employed. Exemplary process parameters for treating exposed metal silicide include, but are not limited to, treating the exposed surface with the hydrogen/nitrogen-containing plasma $NH_3$ for less than 30 seconds, and, more specifically, for only about 10 seconds. In addition, these may include treating the exposed surface at a temperature of about 200–500° C., and at a flow rate of a hydrogen/nitrogen-containing plasma of about 3200–4000 standard centimeter cube per minute (sccm). This exemplary process further includes treating the exposed surface at a pressure of about 3.5 Torr, and using a high frequency/low frequency radio frequency (HF/LFRF) of about 300–600 W/0 W. Later figures discuss in greater detail some of the benefits achieved using similar process parameters, although the measurements provided in the figures should in no way be construed as a limitation on the invention(s) set forth in the claims that follow.

It should be understood that the disclosed technique is not limited to protecting only nickel-based silicides. For example, if titanium silicide is employed and subjected to the disclosed process, the treated layer is now Ti—Si—N, rather than Ni—Si—N. Similarly, if tantalum silicide is employed, the treated layer is now Ta—Si—N, and if cobalt silicide is used, the treated layer is now Co—Si—N. In any case, when subjecting a metal silicide to the disclosed techniques to reduce or prevent the chance of its oxidation during long queue times, the hydrogen/nitrogen-containing compound to which it is exposed results in the treated layer with nitrogen rather than with oxygen (i.e., when oxidizing).

Figure 3:
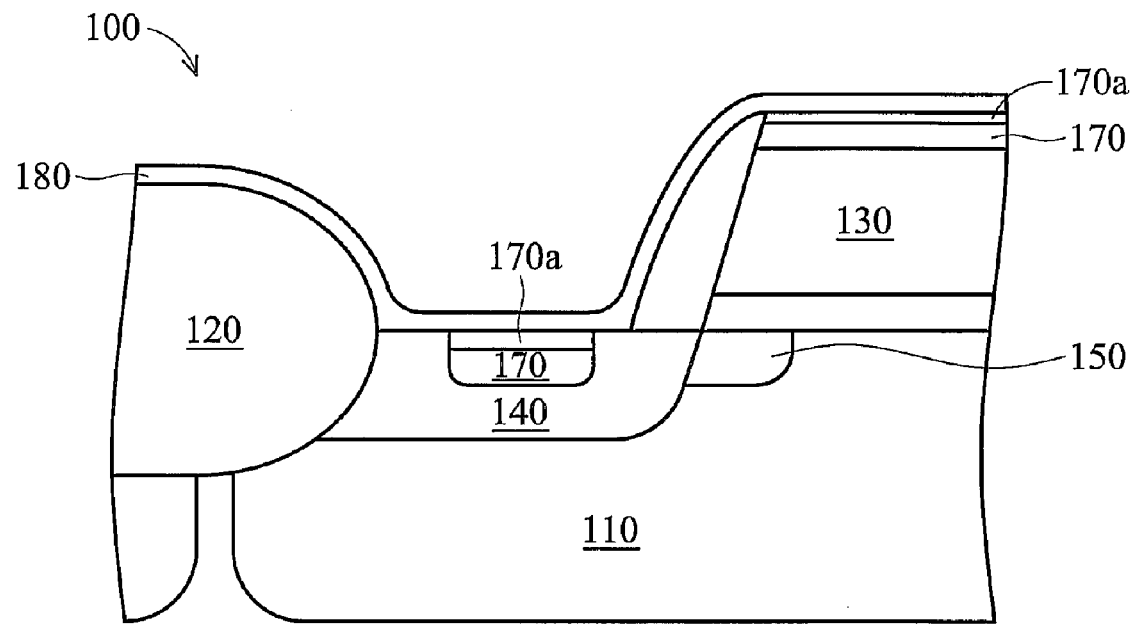
FIG. 3 illustrates the semiconductor device illustrated in FIG. 2 later in the manufacturing process after the metal silicide areas have been treated as disclosed herein.

Looking now at FIG. 3, illustrated is the semiconductor device 100 illustrated in FIG. 2 later in the manufacturing process and after the metal silicide 170 areas have been treated as discussed above. In particular, a dielectric layer 180 has been formed or deposited over the semiconductor device 100, including the metal silicide 170 areas, after they have been treated. In one embodiment, the dielectric layer 180 is deposited as an etch stop layer 180 over the device 100, however, the dielectric layer 180 is not limited to being an etch stop layer.

In this embodiment, the dielectric layer 180 is formed over the exposed surfaces of the treated layer 170a directly after those exposed surfaces are treated with the hydrogen/nitrogen-containing compound, as disclosed. By covering the exposed surfaces directly after their treatment, not only is the oxidation of the metal silicide 170 reduced by the disclosed treatment, but also by no longer having portions of the metal silicide 170 areas exposed. In embodiments where the dielectric layer 180 is an etch stop layer, e.g., for use in setting the depth of a contact etching process, the dielectric layer 180 may be comprised of silicon nitride, silicon oxide, and silicon oxynitride. Of course, other compositions for an etch stop layer are also envisioned.

Figure 4:
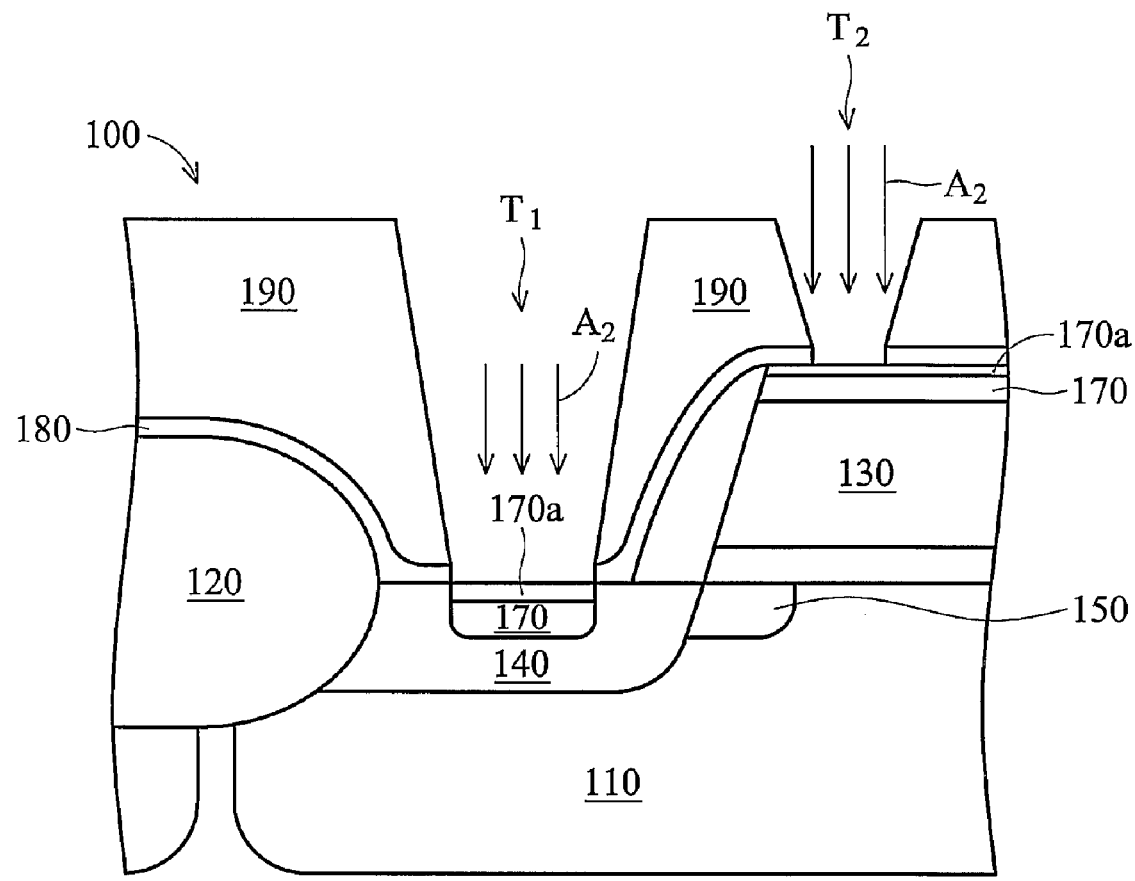
FIG. 4 illustrates another embodiment of the semiconductor device illustrated in FIG. 2 during a different stage of manufacture.
Figure 5A:
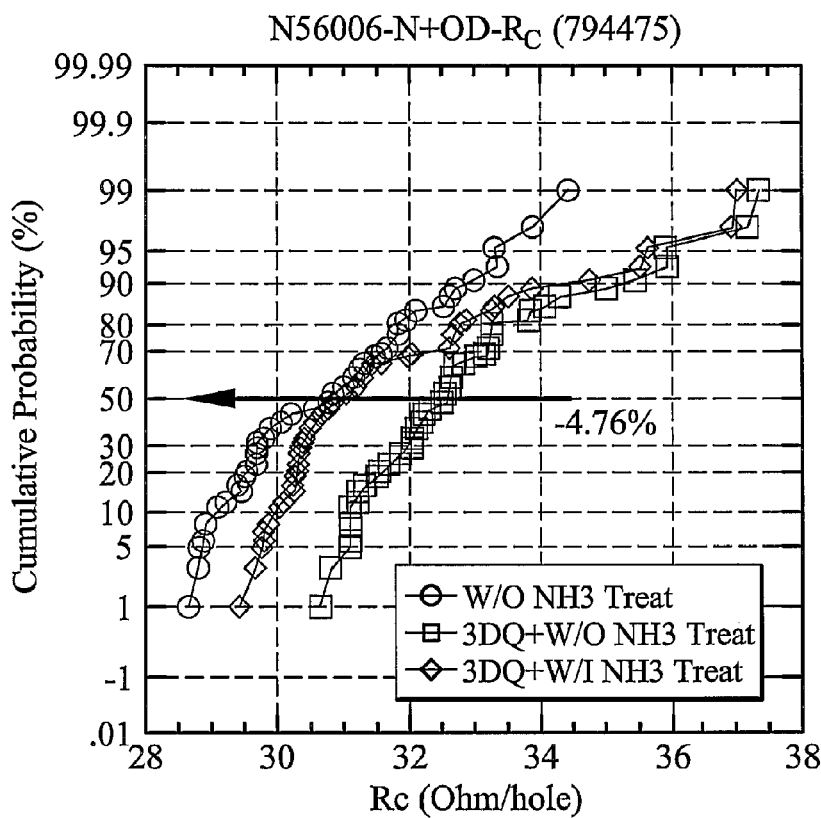
FIGS. 5A–5D illustrate graphs demonstrating the improvements in contact resistance in semiconductor devices when the disclosed treatment process is used.
Figure 5B:
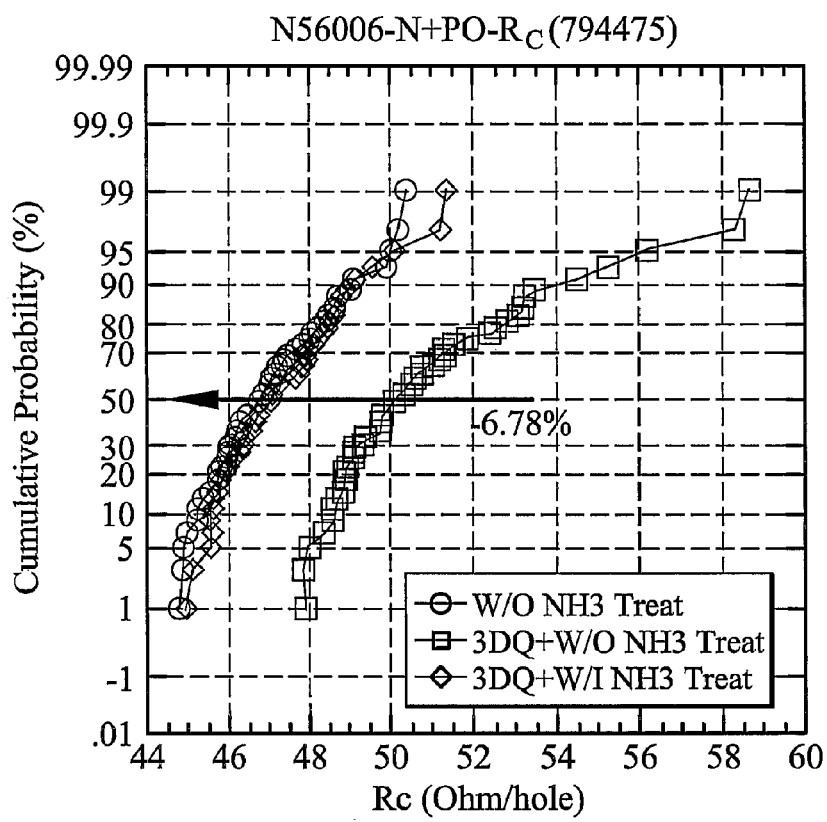
Figure 5C:
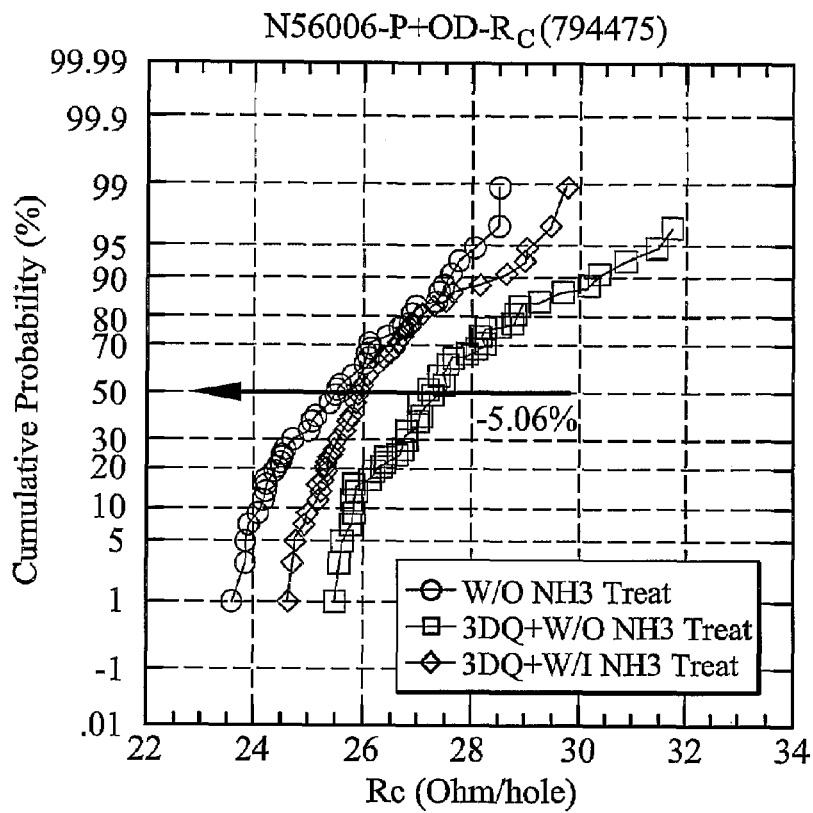
Figure 5D:
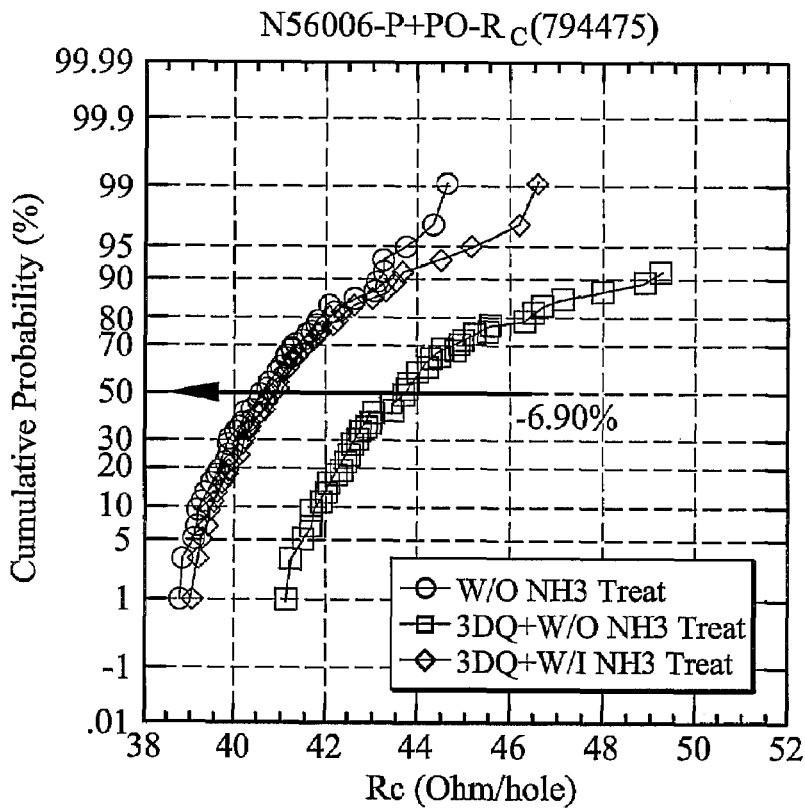
Figure 6A:
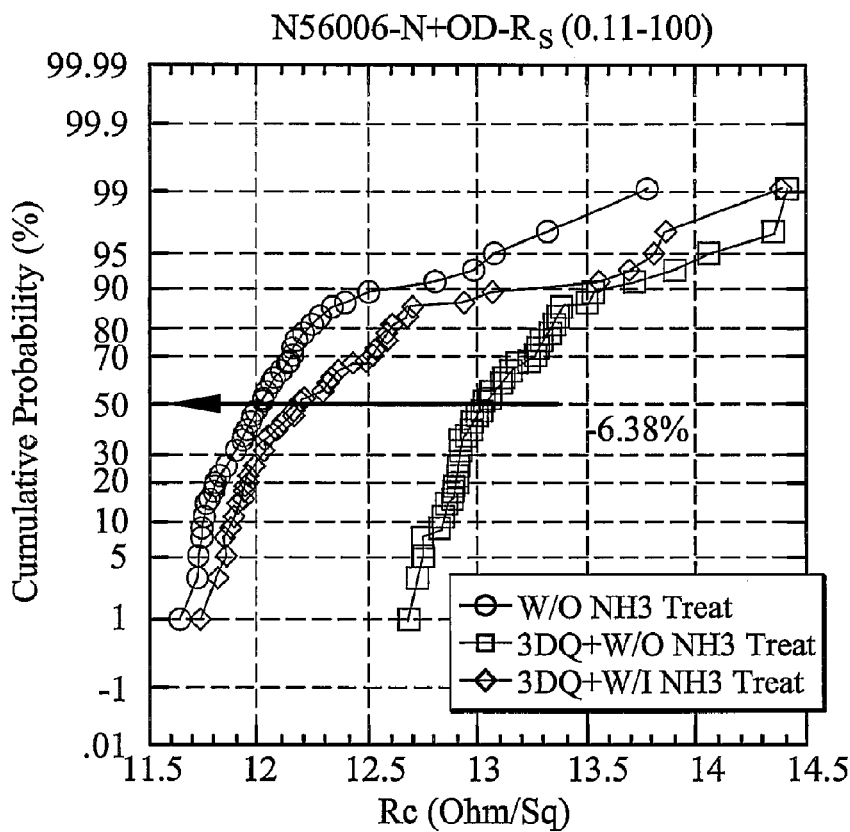
FIGS. 6A–6D illustrate graphs demonstrating the improvements in sheet resistance in semiconductor devices when the disclosed treatment process is used.
Figure 6B:
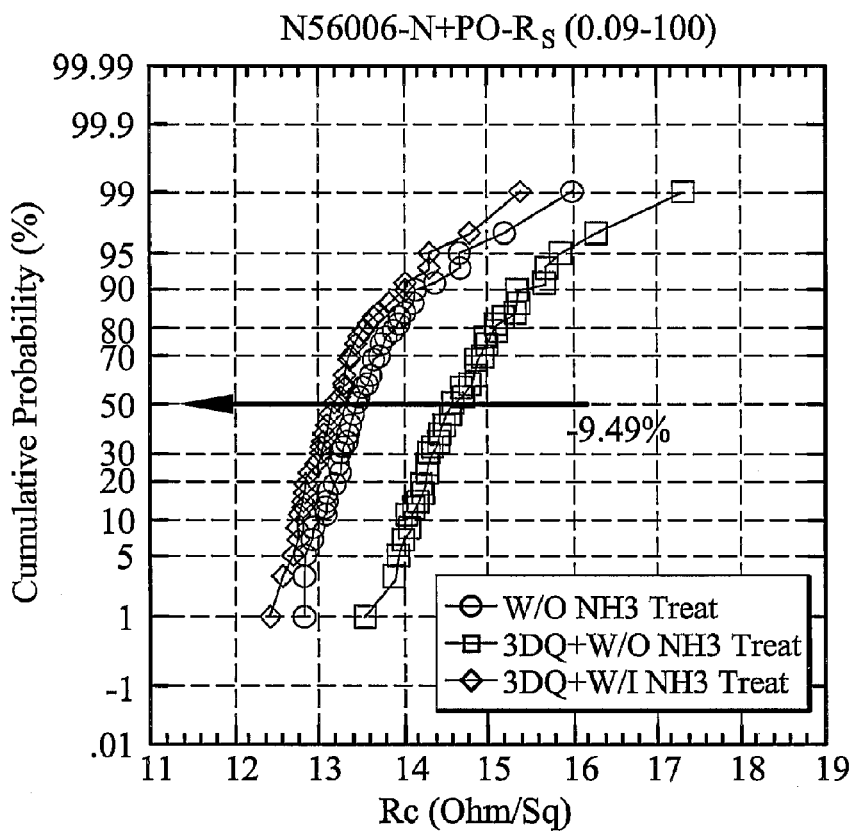
Figure 6C:
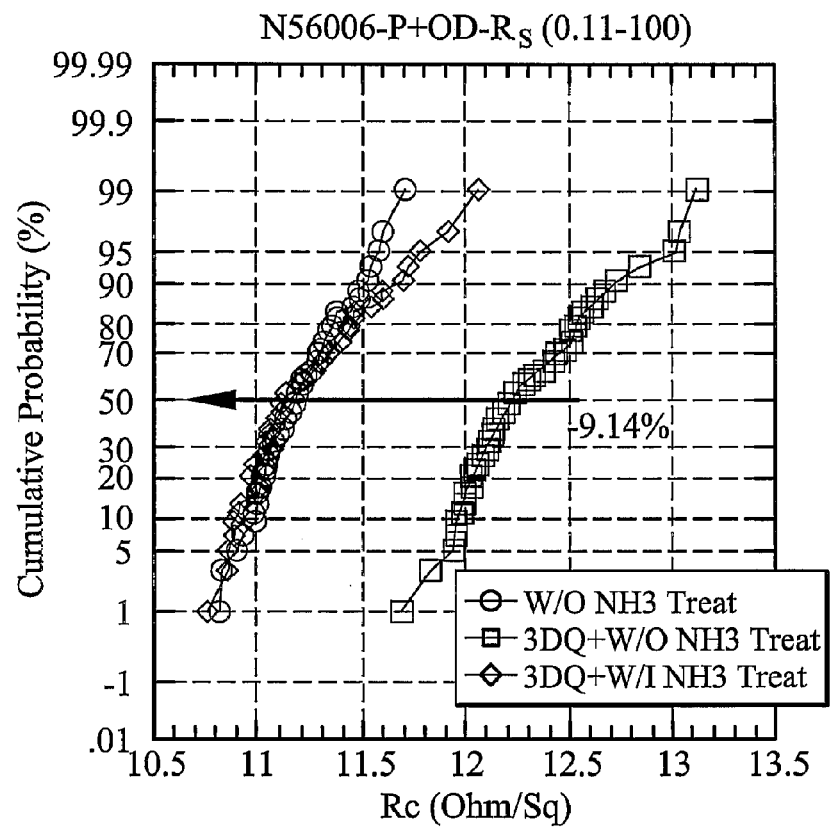
Figure 6D:
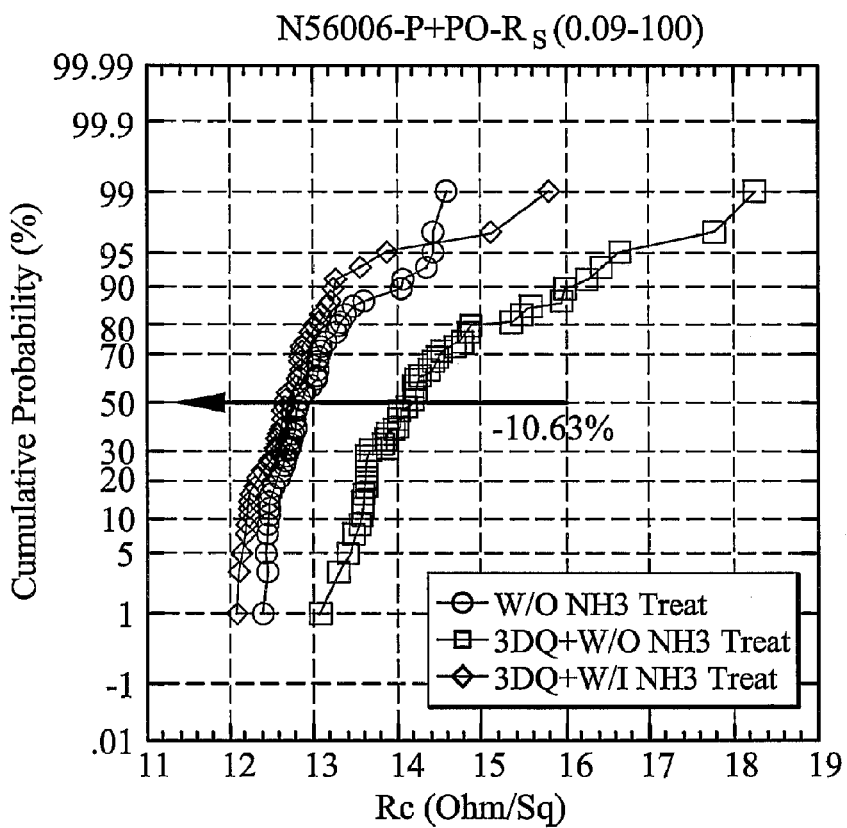

Referring now to FIG. 4, illustrated is another embodiment of the semiconductor device 100 illustrated in FIG. 2 during a different stage of manufacture. Specifically, in this embodiment, the treatment process for the metal silicide 170 areas disclosed herein is not performed before the dielectric layer 180 is deposited. Instead, the metal silicide 170 areas are formed in the source/drain 140 and gate electrode 130 portions of the semiconductor device 100, just as described above. Then, the dielectric layer 180 is deposited over the semiconductor device 100, including the metal silicide 170 areas. In this illustrated embodiment, the dielectric layer 180 is again an etch stop layer 180, and is deposited in areas where certain features of the device 100 (or other areas of the semiconductor wafer) are sought to be protected from the etching process.

Once the desired areas are protected, and thus the depth of the etch in certain places determined, interlevel dielectric layers 190 are formed over the semiconductor device 100, as well as other devices and components of the IC circuit formed on the semiconductor wafer. Then, to reach down to electrically contact the metal silicide 170 areas, trenches T1, T2 are formed in the interlevel dielectric layers 190 using an etching process. Once the trenches T1, T2 have been formed, the metal silicide pads 170 are now exposed again. As before, exposed surfaces of the metal silicide 170 typically begin to oxidize when left exposed, which may be detrimental to overall device performance as discussed above. Therefore, once the trenches T1, T2 have been formed down to the metal silicide 170, the disclosed treatment process may be performed on the exposed surfaces. As such, the same or similar process parameters discussed above may be employed to treat the exposed surfaces of the metal silicide 170 to form the treated layers 170a, and thus significantly reduce or prevent oxidation of the exposed surfaces while the metal silicide 170 areas are exposed.

Furthermore, the disclosed treatment process is not limited to being performed only once on the metal silicide 170 areas, and thus may be performed before the dielectric layer 180 is deposited, as well as after the trenches T1, T2 have been formed. Moreover, it should be noted that if the treatment of the metal silicide 170 is not performed before depositing the dielectric layer 180, and therefore some oxidation on the exposed surfaces of the metal silicide areas 170 has occurred before the dielectric layer 180 can be deposited, the etching process performed to create the trenches T1, T2 may beneficially remove some or all of the oxidation that has already occurred earlier in the process, before the dielectric layer 180 could be deposited. Thus, the treatment process disclosed herein may still be performed through the trenches T1, T2 on primarily unoxidized surfaces of the metal silicide 170, and thus still benefit the contact between semiconductor device 100 and metal vias that fill the trenches T1, T2 and electrically interconnecting the device 100.

Turning now to FIGS. 5A–5D, illustrated are a number of graphs illustrating the improvements in contact resistance (Rc) of the oxide define (OD) or polysilicon (PO) in both PMOS and NMOS semiconductor devices constructed as described above. Similarly, FIGS. 6A–6D illustrate a number of graphs illustrating the improvements in sheet resistance (Rs) of the oxide define (OD) or polysilicon (PO) also in both PMOS and NMOS semiconductor devices. In all the graphs in FIGS. 5A–5D and 6A–6D, measurements taken are illustrated in three situations:

○—Testing when there has been no queue time and when the disclosed treatment has not been performed (W/O $NH_3$ Treat);

□—Testing when there has been a 3-day queue time (3DQ) and when the disclosed treatment has not been performed (W/O $NH_3$ Treat); and ◇—Testing when there has been a 3-day queue time (3DQ), but the disclosed treatment has been performed (W/I $NH_3$ Treat) before the queue time began.

In all of these situations, the exemplary treatment performed on exposed metal silicide is performed using $NH_3$ plasma, however, other beneficial results are also possible when other hydrogen/nitrogen-containing compounds or plasmas are employed.

In FIGS. 5A–5D, the contact resistance (Rc) is measured in Ohms/hole, and is plotted on each of the graphs as a function of cumulative probability (%). As can easily be seen, the Rc of oxide define (OD) improves −4.76% and −5.06% for NMOS and PMOS devices, respectively, when the disclosed treatment process is employed, versus when it is not employed, and a 3-day queue time for the wafer occurs. Even more obvious is the Rc of polysilicon (PO) improvement of −6.78% and −6.90% for NMOS and PMOS devices, respectively, when the disclosed treatment process is employed, versus when it is not employed, and a 3-day queue time for the wafer occurs. As can be seen, the improvement in Rc for polysilicon when the disclosed treatment process is employed in 3-day queue times virtually equals performance when no queue time occurs at all.

In FIGS. 6A–6D, the sheet resistance (Rs) is measured in Ohm/square, and is plotted as in the other graphs as a function of cumulative probability (%). As with the Rc measurements discussed above, the Rs of oxide define (OD) improves −6.38% and −9.14% for NMOS and PMOS devices, respectively, when the disclosed treatment process is employed, versus when it is not employed, and a 3-day queue time for the wafer occurs. The Rs of polysilicon (PO) improvement of −9.49% and −10.63% for NMOS and PMOS devices, respectively, when the disclosed treatment process is employed, versus when it is not employed, and a 3-day queue time for the wafer occurs. As can be seen, the improvement in Rs for both OD and PO, in both NMOS and PMOS devices, when the disclosed treatment process is employed in 3-day queue times virtually equals performance when no queue time occurs at all.

Figure 7A:
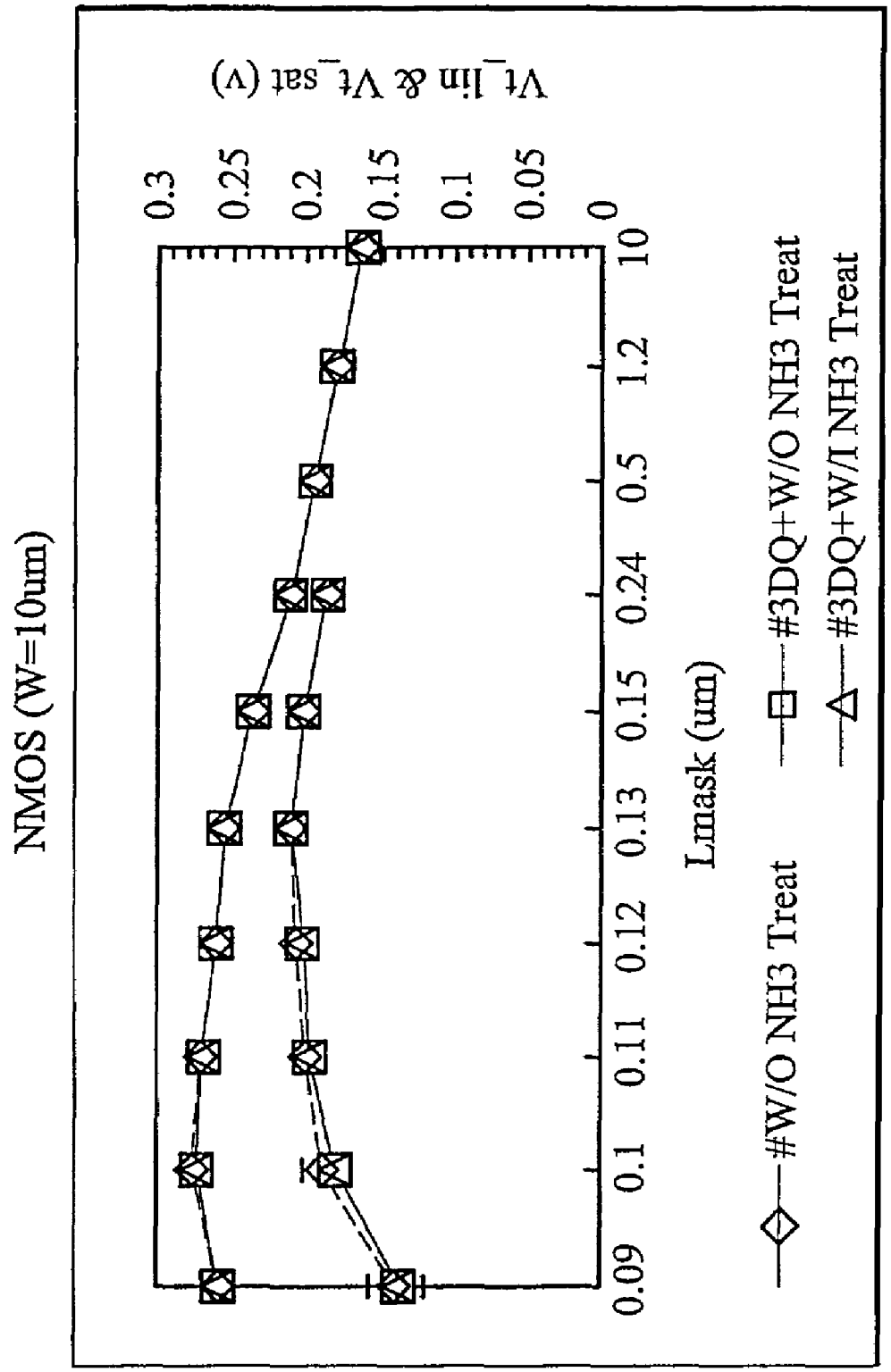
FIGS. 7A–7B and FIGS. 8A–8B illustrate graphs demonstrating improvements in wafer acceptance testing (WAT) performance in semiconductor devices when the disclosed treatment process is used
Figure 7B:
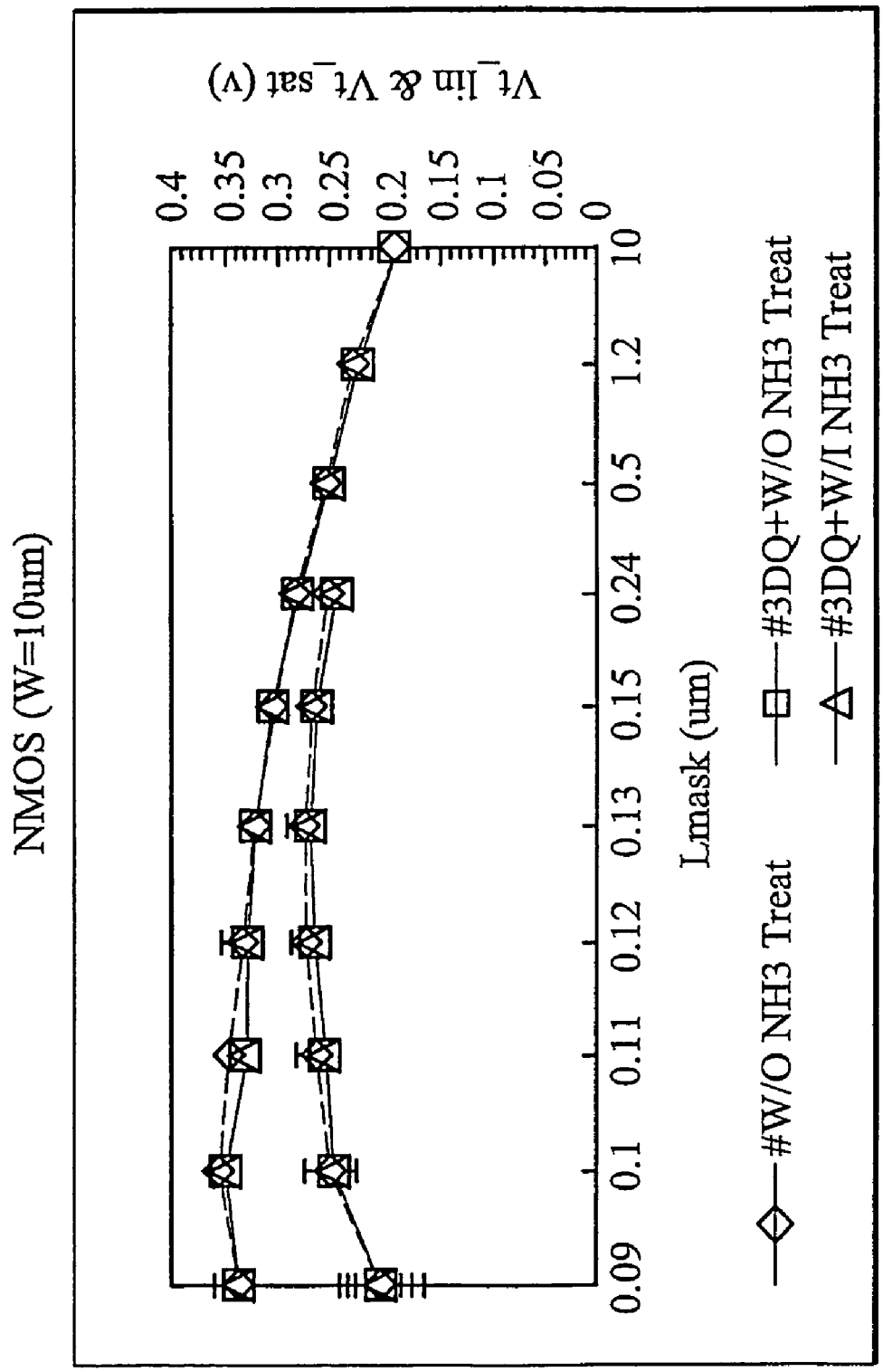
Figure 8A:
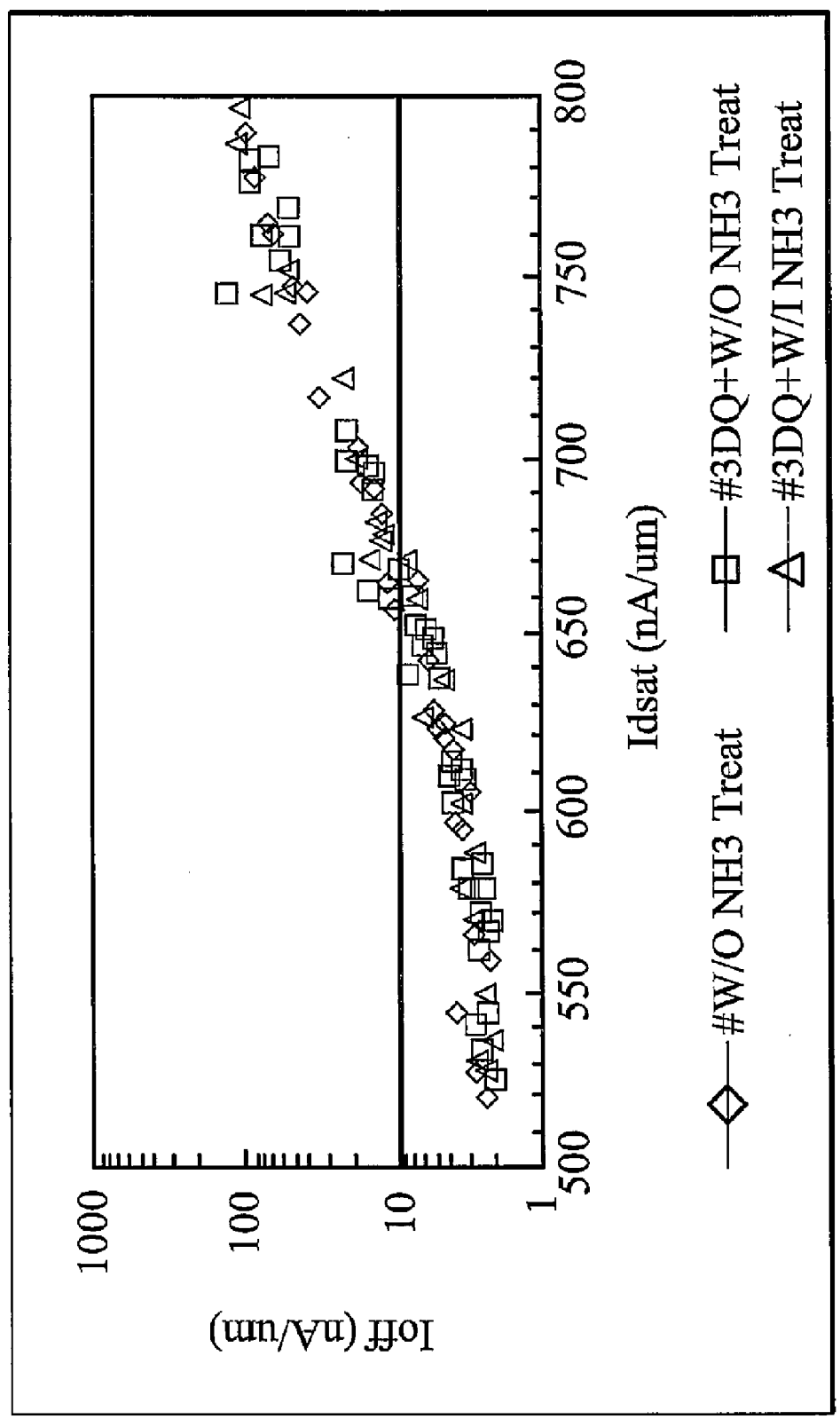
Figure 8B:
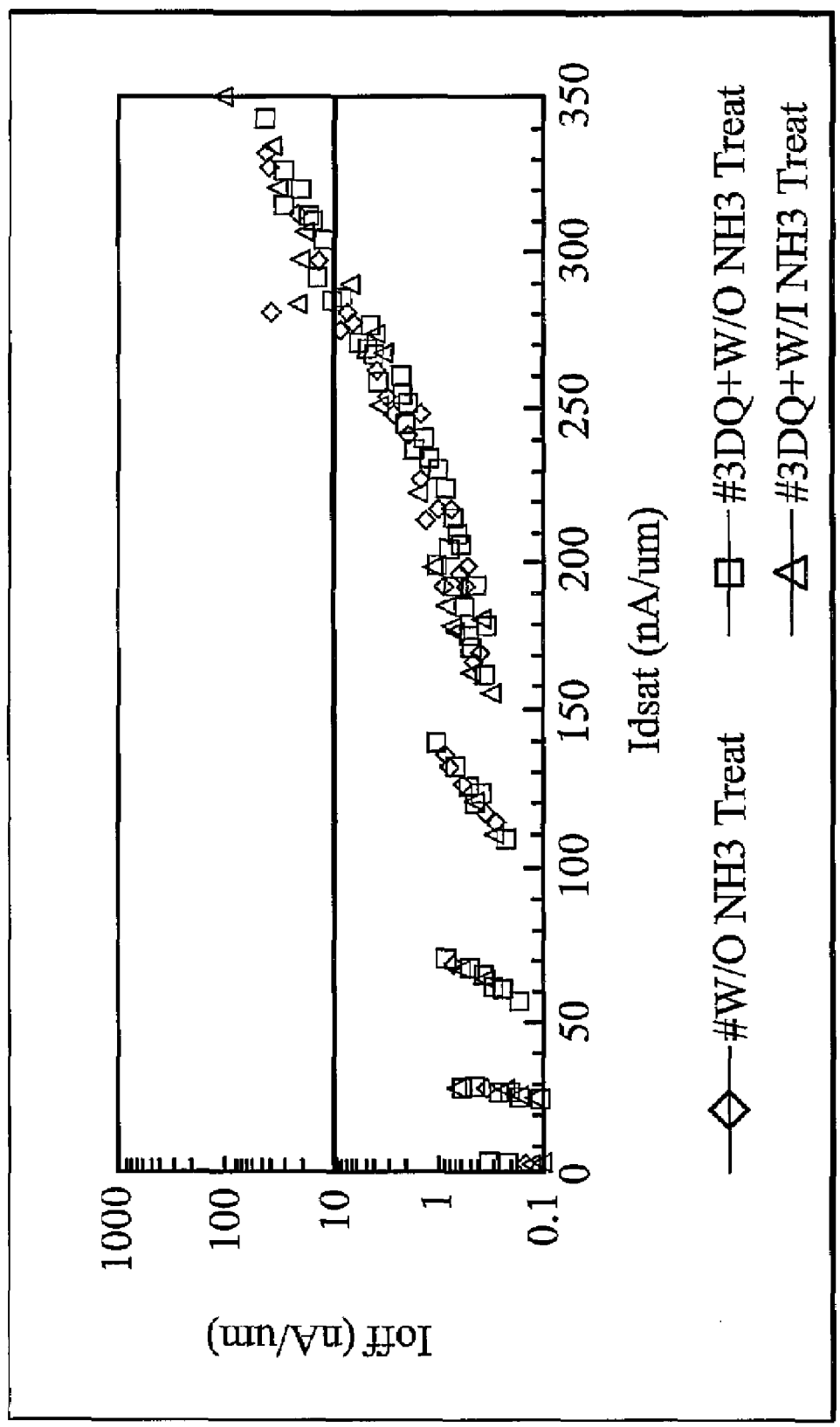

Looking now at FIGS. 7A–7B, illustrated are graphs illustrating the improvements in linear threshold voltage (Vt_lin) & saturation threshold voltage (Vt_sat) as a function of mask length (Lmask) for NMOS and PMOS devices having a gate width of 10 µm. FIGS. 8A–8B illustrate graphs illustrating the improvements in saturation drain current (Idsat) as a function of off-current (Ioff) also for NMOS and PMOS devices having a gate width of 10 µm. In all the graphs in FIGS. 7A–7B and 8A–8B, measurements taken are again illustrated in three situations:

◊—Testing when there has been no queue time and when the disclosed treatment has not been performed (W/O $NH_3$ Treat);

□—Testing when there has been a 3-day queue time (3DQ) and when the disclosed treatment has not been performed (W/O $NH_3$ Treat); and Δ—Testing when there has been a 3-day queue time (3DQ), but the disclosed treatment has been performed (W/I $NH_3$ Treat) before the queue time began.

As before, in all of these situations, the exemplary treatment performed on exposed metal silicide is performed using $NH_3$ plasma, however, other beneficial results are also possible when other hydrogen/nitrogen-containing compounds or plasmas are employed.

While various embodiments of the disclosed techniques have been described above, it should be understood that they have been presented by way of example only, and not limitation. Thus, the breadth and scope of the invention(s) should not be limited by any of the above-described exemplary embodiments, but should be defined only in accordance with any claims and their equivalents issuing from this disclosure. Furthermore, the above advantages and features are provided in described embodiments, but shall not limit the application of such issued claims to processes and structures accomplishing any or all of the above advantages.

Additionally, the section headings herein are provided for consistency with the suggestions under 37 CFR 1.77 or otherwise to provide organizational cues. These headings shall not limit or characterize the invention(s) set out in any claims that may issue from this disclosure. Specifically and by way of example, although the headings refer to a "Technical Field," such claims should not be limited by the language chosen under this heading to describe the so-called technical field. Further, a description of a technology in the "Background" is not to be construed as an admission that technology is prior art to any invention(s) in this disclosure. Neither is the "Brief Summary" to be considered as a characterization of the invention(s) set forth in issued claims. Furthermore, any reference in this disclosure to "invention" in the singular should not be used to argue that there is only a single point of novelty in this disclosure. Multiple inventions may be set forth according to the limitations of the multiple claims issuing from this disclosure, and such claims accordingly define the invention(s), and their equivalents, that are protected thereby. In all instances, the scope of such claims shall be considered on their own merits in light of this disclosure, but should not be constrained by the headings set forth herein.

What is claimed is:

1. A method of manufacturing a semiconductor device, the method comprising:
   providing a semiconductor substrate;
   forming a metal silicide on the semiconductor substrate; and
   treating an exposed surface of the metal silicide with a hydrogen/nitrogen-containing compound to form a Metal-Si—N treated layer on the exposed surface, the nitride portion of the treated layer hindering oxidation of the exposed surface.

2. The method according to claim 1, wherein the treating further comprises treating the exposed surface for less than 30 seconds.

3. The method according to claim 2, wherein treating further comprises treating the exposed surface for about 10 seconds.

4. The method according to claim 1, wherein the hydrogen/nitrogen-containing compound is a hydrogen/nitrogen-containing plasma.

5. The method according to claim 1, wherein the hydrogen/nitrogen-containing compound is selected from the group consisting of $NH_3$, $H_2+N_2$, and $NH_3+N_2$.

6. The method according to claim 1, wherein the treating further comprises treating the exposed surface at a temperature of about 200–500° C.

7. The method according to claim 1, wherein the treating further comprises treating the exposed surface using a flow rate of 3200–4000 sccm.

8. The method according to claim 1, wherein the treating further comprises treating the exposed surface at a pressure of about 3.5 Torr.

9. The method according to claim 1, wherein the treating further comprises treating the exposed surface using a high frequency/low frequency radio frequency of about 300–600 W/0 W.

10. The method according to claim 1, further comprising treating the exposed surface after-performing a contact etch process to create a trench down to the metal silicide, the contact etch process removing at least some of the oxidized portions before the treating.

11. The method according to claim 1, further comprising depositing a contact etch stop layer over the treated layer but before depositing the dielectric layer.

12. The method according to claim 1, wherein forming a metal silicide comprises forming a metal silicide selected from the group consisting of nickel silicide, cobalt silicide, titanium silicide, tantalum silicide, and tungsten silicide.

13. The method according to claim 1, wherein the forming comprises forming nickel silicide, and the treating comprises treating an exposed surface of the nickel silicide with $NH_3$ plasma to form a Ni—Si—N treated layer on the exposed surface, the treated layer hindering the formation of NiO on the exposed surface.

14. The method according to claim 13, wherein the treating further comprises treating the exposed surface for less than about 30 seconds, at a temperature of about 200–500° C., using a flow rate of 3200–4000 sccm, at a pressure of about 3.5 Torr, and using a high frequency/low frequency radio frequency of about 300–600 W/0 W.

15. A semiconductor device, comprising:
   a semiconductor substrate;
   a metal silicide formed on the semiconductor substrate;
   a treated layer comprising Metal-Si—N formed from an exposed surface of the metal silicide by treating the exposed surface with a hydrogen/nitrogen-containing compound, the nitride portion of the treated layer hindering oxidation of the exposed surface.

16. The device according to claim 15, wherein the metal silicide is nickel silicide and the treated layer is Ni—Si—N.

17. The device according to claim 15, further comprising a contact etch stop layer deposited over the treated layer.

18. The device according to claim 15, wherein the metal silicide is selected from the group consisting of nickel silicide, cobalt silicide, titanium silicide, tantalum silicide, and tungsten silicide.

19. The device according to claim 15, wherein the semiconductor device is a transistor.

20. The device according to claim 15, wherein the metal silicide comprises nickel silicide, and the treated layer comprises Ni—Si—N formed by treating the exposed surface of the nickel silicide with $NH_3$ plasma, the treated layer hindering the formation of NiO on the exposed surface.

* * * * *